US008313626B2

(12) United States Patent
Hirahara et al.

(10) Patent No.: US 8,313,626 B2
(45) Date of Patent: Nov. 20, 2012

(54) MICROFLUIDIC DEVICE AND ANALYZING DEVICE USING THE SAME

(75) Inventors: Shuzo Hirahara, Yokohama (JP); Tomoyuki Tsuruta, Toyota (JP); Haruyuki Minamitani, Yokohama (JP)

(73) Assignee: Fluid Incorporated, Yokohama (JP)

( * ) Notice: Subject to any disclaimer, the term of this patent is extended or adjusted under 35 U.S.C. 154(b) by 0 days.

(21) Appl. No.: 13/067,005

(22) Filed: May 2, 2011

(65) Prior Publication Data

US 2011/0284375 A1 Nov. 24, 2011

Related U.S. Application Data

(62) Division of application No. 12/000,897, filed on Dec. 18, 2007, now abandoned.

(30) Foreign Application Priority Data

Dec. 19, 2006 (JP) ................................ 2006-340628

(51) Int. Cl.
*G01N 27/26* (2006.01)
*B81B 1/00* (2006.01)

(52) U.S. Cl. ......................... 204/450; 204/618; 204/600

(58) Field of Classification Search .......... 204/600–612, 204/400, 450, 547
See application file for complete search history.

(56) References Cited

U.S. PATENT DOCUMENTS

| | | | | |
|---|---|---|---|---|
| 5,569,367 | A * | 10/1996 | Betts et al. | 204/547 |
| 6,261,066 | B1 | 7/2001 | Linnemann et al. | |
| 6,537,437 | B1 | 3/2003 | Galambos et al. | |
| 2002/0023841 | A1* | 2/2002 | Ahn et al. | 204/547 |
| 2004/0011651 | A1* | 1/2004 | Becker et al. | 204/547 |
| 2005/0230251 | A1 | 10/2005 | Eidsnes et al. | |
| 2006/0169589 | A1 | 8/2006 | Takagi et al. | |
| 2008/0011608 | A1 | 1/2008 | Pham et al. | |

FOREIGN PATENT DOCUMENTS

EP 1 627 685 A1 2/2006

(Continued)

OTHER PUBLICATIONS

Lian ("Microfluidic manipulation by AC Electrothermal effect." PhD diss., University of Tennessee, 2010).*

(Continued)

*Primary Examiner* — Jeffrey T Barton
*Assistant Examiner* — Jennifer Dieterle
(74) *Attorney, Agent, or Firm* — Edwards Wildman Palmer LLP; James E. Armstrong, IV; Stephen D. LeBarron

(57) ABSTRACT

The conventional micropump and the conventional micromixer have the following problems. In a mechanical or hydrodynamic method, the structure of the inside of a flow path is complex so as to easily cause clogging, and manufacturing cost is high, and dead volume is large. Additionally, in an electrical method, the conventional micropump or the conventional micromixer was incapable of operating with a liquid having the concentration of a physiological saline that is important in the medical or biological field although the structure of the flow path is simple. These problems are solved by applying an AC voltage to a pair of electrodes in which an electrode-to-electrode gap between the pair of electrodes is vertically arranged and by generating the flow of a fluid in the direction opposite to gravity along the electrode-to-electrode gap. A micropump (43, 44) can be realized especially by forming a micro-sized flow path (11) in the vertical direction along the electrode-to-electrode gap, and a micromixer (41) can be realized by forming a micro-sized flow path (11) in the horizontal direction to cross at right angle to the electrode-to-electrode gap.

4 Claims, 11 Drawing Sheets

FOREIGN PATENT DOCUMENTS

| | | | |
|---|---|---|---|
| JP | 04-277425 | A | 10/1992 |
| JP | 09-058017 | A | 3/1997 |
| JP | 2002-527254 | A | 8/2002 |
| JP | 2005-538853 | A | 12/2005 |
| JP | 2006-205092 | A | 8/2006 |
| JP | 2006-320877 | A | 11/2006 |
| WO | WO-98/51929 | A1 | 11/1998 |
| WO | WO-00/21659 | A1 | 4/2000 |
| WO | WO-03/011443 | A2 | 2/2003 |
| WO | WO2005/123898 | * | 12/2005 |
| WO | WO-2006/037910 | A1 | 4/2006 |

OTHER PUBLICATIONS

A.B.D. Brown et al., "Pumping of Warter with AE Electric Fields Applied to Asymmetric Pairs of Microelectrodes", Physical Review E, vol. 63, Dec. 2000.

Marin Sigurdson et al., "Electrothermal Stirring for Heterogeneous Immunoassays", Lab on a Chip, vol. 5, pp. 1366-1373, 2005.

V. Studer et al., "An Integrated AC Electrokinetic Pump in a Microfluidic Loop for Fast and Tunable Flow Control", Analyst, vol. 129, pp. 944-949, 2004.

N. Sasaki et al., AC Electroosmotic Micromixer for Chemical Processing in a Microchannel, Lab on a Chip, vol. 6, pp. 550-554, 2006.

W.M. Arnold, "Positioning and Levitation Media for the Seperation of Biological Cells", IEEE Transactions on Industry Applications, vol. 37, No. 5, pp. 1468-1475, 2001.

Madhavi Krishnan et al., "Reactions and Fluidics in Miniaturized Natural Convection Systems", Analytical Chemistry, vol. 76, pp. 6254-6265, 2004.

European Search Report in corresponding European Patent Application No. EP 07 02 4503, Mar. 25, 2009.

Shuzo Hirahara et al., "Swirling of Isotonic Saline Induced by AC Electrodes in a Micro Channel", Proceedings of 26-th Symposium on Capillary Electrophoresis, Nov. 12, 2006, pp. 58-59.

* cited by examiner

MICROFLUIDIC DEVICE AND ANALYZING DEVICE USING THE SAME

CROSS REFERENCE TO RELATED APPLICATIONS

This application is a Divisional of U.S. patent application Ser. No. 12/000,897, filed Dec. 18, 2007, which application claims benefit to Japanese Pat. App. No. 2006-340628, filed Dec. 19, 2006, which application is incorporated herein by reference.

BACKGROUND ART

1. Technical Field

This invention relates to a microfluidic device that has micro-sized flow paths dug into a glass substrate or a plastic substrate so as to make an analysis or produce a reaction in the flow paths by use of small amounts of samples and, more specifically, to a micropump that generates a flow in the direction of a flow-path axis while driving liquids in flow paths and to a micromixer that stirs and mixes liquids together while generating a swirling flow. Additionally, this invention relates to an analytical instrument that uses liquid or a particulate material flowing in liquids as a sample and that measures progress information about reactions to a reagent or collects reaction products.

2. Description of the Related Art

In recent years, to reduce the amount of samples and save process steps, a reactor or an analysis method that uses a microfluidic device widely has spread. An electro-osmotic flow or a pressure flow is widely used as a method for conveying liquids in the microfluidic device. However, disadvantageously, many high-voltage power supplies and many pumps will be needed, and peripheral devices will be made large in size if micro-sized flow paths are complexly structured. Additionally, there remain unsolved problems, such as the "dead volume" problem of being incapable of reducing the rate of useless samples by use of an electro-osmotic flow or a pressure flow although the amount of samples to be used has become small by micronizing a flow path.

To make the whole device compact, a pump formed in the microfluidic device has been designed. Examples of such pumps include a mechanical pump using a diaphragm shown in Patent Document 1 and an electric pump using the action of an AC electro-osmotic flow shown in Non-Patent Document 1. However, the mechanical pump has defects one of which is the fact that special materials, such as piezoelectric material and bimetal, are needed and another one of which is the fact that many production processes must be followed. Therefore, a rise in manufacturing costs is caused, and a complex structure having great "dead volume" is formed. Additionally, disadvantageously, clogging is liable to occur, and a pulsating flow is caused. In contrast, the electric pump advantageously has a simple structure. However, the electric pump is not operated with the electrical conductivity (1.6 siemens per meter (S/m)) of a physiological saline used and important in medical and biological fields, and is only operated with the electrical conductivity of a liquid which is equal to or less than 1/100 (i.e., about 10 millisiemens per meter (mS/m)) of that of the physiological saline at a maximum.

On the other hand, the microfluidic device is characterized in that a diffusion-controlled chemical reaction is accelerated by a size effect, in that a slight amount of fluid is treated in a tightly-sealed state, hence in that environmental pollution can be prevented, in that a temperature-control response is swift, in that a reaction field having no temperature distribution can be obtained, and in that poisonous materials or an unstable, explosive sample can be managed under safe environmental conditions. Therefore, the microfluidic device also has been highly expected as a microchemical reactor. However, disadvantageously, it is difficult to secure a necessary reaction time, because one of the restrictions imposed on the microfluidic device is that the flow path, which is a reaction field, is short.

To hasten the reaction time, various mixers have been designed. Examples of such mixers include a hydrodynamic mixer (chaotic mixing) in which an obstacle is placed in a flow path as shown in Patent Document 2 and an electric mixer that uses an electrothermal effect or an AC electro-osmotic flow as shown in Non-Patent Document 2 and Patent Document 3. However, the hydrodynamic mixer needs a special microfabrication technique, and has many production processes, and hence is high in manufacturing costs. In addition, disadvantageously, the hydrodynamic mixer has a complex flow path structure that easily causes clogging, and has great flow path resistance resulting from the use of a flow force for stirring. On the other hand, the electric mixer has the advantage of having a simple structure as already described in the pump. However, the electric mixer is not operated with the electrical conductivity of a physiological saline used and important in medical and biological fields, and is only operated with the electrical conductivity of a liquid which is equal to or less than 1/100 of that of the physiological saline at a maximum.

[Patent Document 1] WO 98/51929

[Patent Document 2] WO 03/011443

[Patent Document 3] Japanese Unexamined Patent Application Publication No. 2006-320877

[Non-Patent Document 1] A. B. D. Brown, C. G. Smith, and A. R. Rennie: "Pumping of water with ac electric fields applied to asymmetric pairs of microelectrodes", Physical Review E, vol. 63, 016305 (2000)

[Non-Patent Document 2] Marin Sigurdson, Dazhi Wang, and Carl D. Meinhart: "Electrothermal stirring for heterogeneous immunoassays", Lab on a Chip, vol. 5, pp. 1366-1373 (2005)

SUMMARY OF THE INVENTION

As described in the background art, the conventional micropump and the conventional micromixer have the following defects. According to a mechanical or hydrodynamic method, the structure of the inside of a flow path is complex so as to easily cause clogging, and manufacturing costs are high, and the dead volume is great. Additionally, although an electrical method is simple, the conventional micropump or the conventional micromixer is incapable of operating with a liquid having the concentration of a physiological saline that is important in the medical or biological field.

The present invention solves the above problems by disposing two flat electrodes used as a pair so that an electrode-to-electrode gap therebetween is directed in the vertical direction or in the diagonal direction and by generating a fast flow ascending in the direction opposite to gravity along the electrode-to-electrode gap while applying an AC voltage thereto. The device of the present invention differs from the conventional chip microfluidic device. In more detail, the device of the present invention is used in a state of being vertically oriented, whereas the conventional chip microfluidic device is used in a state of being laid on a horizontally oriented plane. Especially, the micropump of the present invention is realized by forming a micro-sized flow path in the vertical direction along the electrode-to-electrode gap, and a micromixer is realized by forming a micro-sized flow path in the horizontal direction intersecting with the electrode-to-electrode gap at right angles.

According to a method of using AC electrodes which is superior in having a simple structure, the microfluidic device provided by the present invention realizes a micropump or a micromixer that exhibits sufficient performance even in a liquid having a high electrical conductivity, such as a physiological saline in which the conventional device does not operate.

The micropump of the present invention not only can perform accurate setting by controlling an AC voltage applied to the electrodes but also can operate even in a closed circulatory flow path, and hence two micropumps can be disposed at two positions, respectively, in the circulatory flow path. With this structure, the selection from between the clockwise circulating direction and the counterclockwise circulating direction, the flow speed, and the stop position can be freely controlled with high accuracy by using a simple electric circuit, and a user-friendly micropump can be achieved.

Additionally, the micromixer of the present invention can operate even in a state in which a flow in the direction of the flow path is stopped. In the flow-stopped state, mixing in an extremely short distance that corresponds to the size (about four times as long as the width of the flow path) of two generated eddies can be continuously performed for an arbitrary time, and high-performance mixing in which the amount of samples consumed is small can be achieved.

Additionally, an analytical instrument having less dead volume is achieved by using a microfluidic device including the micropump and the micromixer of the present invention.

This specification contains the contents mentioned in the description and/or the drawings of Japanese Patent Application No. 2006-340628 that is the basis of the priority of the present application.

DETAILED DESCRIPTION OF THE INVENTION

A detailed description will be hereinafter given of embodiments of a micropump and a micromixer by a microfluidic device of the present invention and embodiments constituting an analytical instrument.

Embodiment 1

First, a description will be given of a flow of a microfluid generated by action from AC electrodes. An electrothermal effect shown in Non-Patent Document 2 or a method of using the phenomenon of an AC electro-osmotic flow shown in Patent Document 3 is known as an electrical method of allowing a fluid to run in a micro-sized space.

Figure 1:
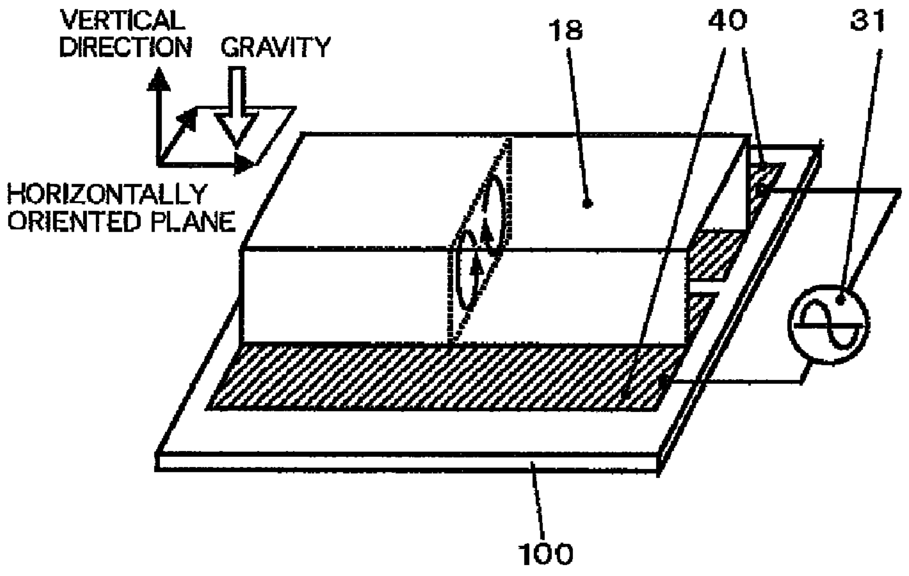
FIG. 1 PRIOR ART
FIG. 1 is a partially enlarged view of a conventional microfluidic device.

FIG. 1 is a partially enlarged view of a conventional microfluidic device. The conventional microfluidic device is made up of a substrate 100, a pair of electrodes 40, an AC power 31, and sidewalls 18 forming a micro-sized flow path. The present inventors performed experiments using the conventional microfluidic device structured as shown in FIG. 1 in which the pair of electrodes 40 being in contact with the micro-sized flow path exist in a horizontally oriented plane. In the experiments, saline solutions differing in electrical conductivity (substantially proportional to its concentration) were used, and an AC voltage of 5 MHz was applied. In a saline solution whose electrical conductivity is equal to or greater than several tens of mS/m, a flow that corresponds to the above-mentioned two phenomena (i.e., the electrothermal effect and the AC electro-osmotic flow) was not observed. Instead, a significantly slow flow (whose speed is equal to or less than several micrometers/s) which is rotated in a direction opposite to the direction expected from the two phenomena, was observed.

Figure 2:
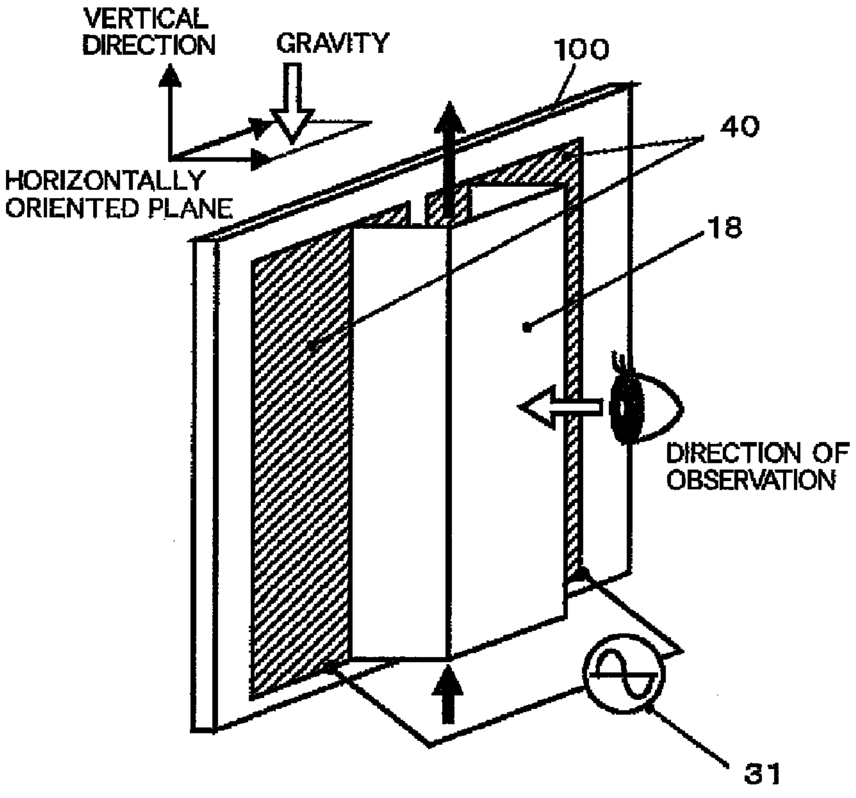
FIG. 2 is an enlarged view of a micropump of the present invention.

FIG. 2 is an enlarged view of a micropump of the present invention. The micropump is the same in the basic structure as the conventional microfluidic device, and is different in the direction to be arranged therefrom. An experiment was performed as shown in FIG. 2 in which the microfluidic device is vertically oriented and in which the direction of an electrode-to-electrode gap of the pair of electrodes 40 is set in the vertical direction. As a result, the present inventors found that a fast flow (several hundred micrometers/s to several millimeters/s) running in the direction of the arrow in a micro-sized flow path 11 is generated. This flow, which is different from the above-mentioned, two well-known phenomena, occurs in a saline solution whose electrical conductivity is equal to or greater than several tens of mS/m. In this flow, the liquid between the electrodes always runs in the direction opposite to gravity, and hence the present inventors presumed that this flow is a buoyant flow generated by Joule heat in the saline solution.

Figure 3:
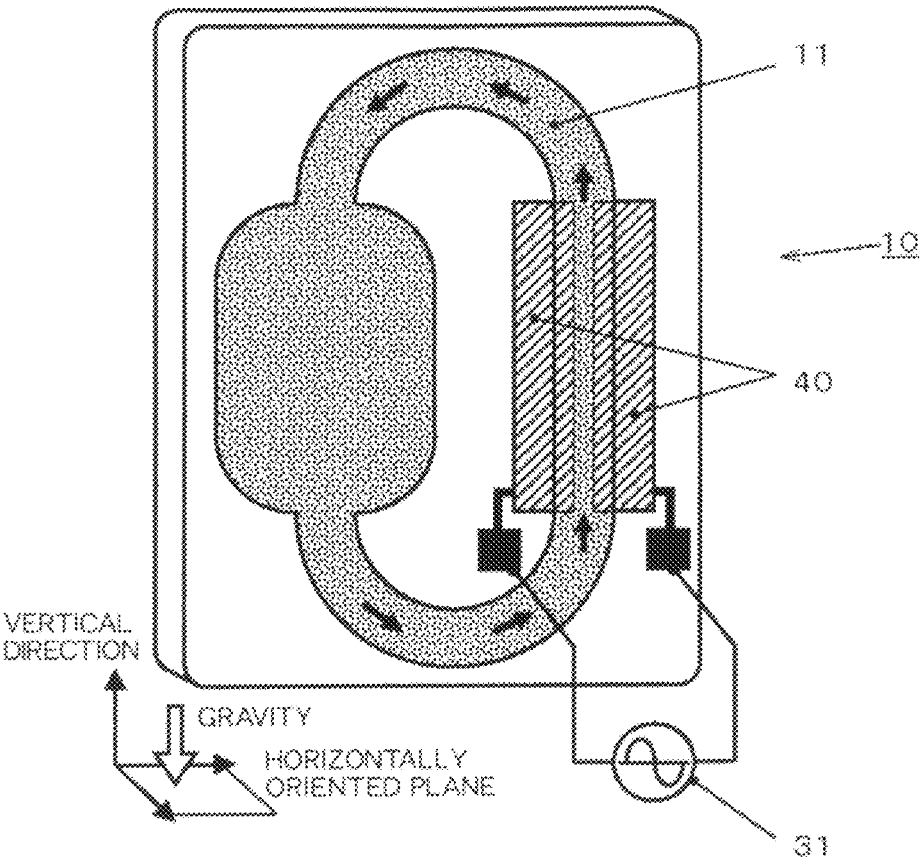
FIG. 3 is an elevational view of a microfluidic device provided with the micropump.

FIG. 3 is an elevational view of a microfluidic device provided with the micropump. In an embodiment shown in FIG. 3, the micropump 10 is formed by combining a closed circulatory micro-sized flow path 11 with a pair of electrodes 40 arranged in the vertical direction.

Figure 4:
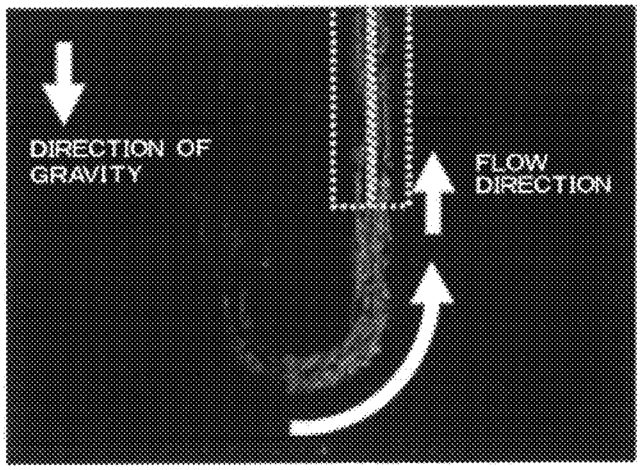
FIG. 4 is a photograph in which a flow line near an inflow port of the micropump is visualized.

FIG. 4 is a photograph in which a flow line near an inflow port of the micropump is visualized. The photograph of FIG.

4 is one image obtained by pouring a physiological saline (whose electrical conductivity is 1.6 S/m) having fluorescent beads (whose particle size is 6 μm) dispersed to visualize its flow into the microfluidic device of FIG. 3 and by observing the flow running below the pair of electrodes 40. It should be noted that this image was obtained by superimposing photographed video images on each other for five seconds, and was subjected to image processing to obtain tracks of the fluorescent beads.

Figure 5:
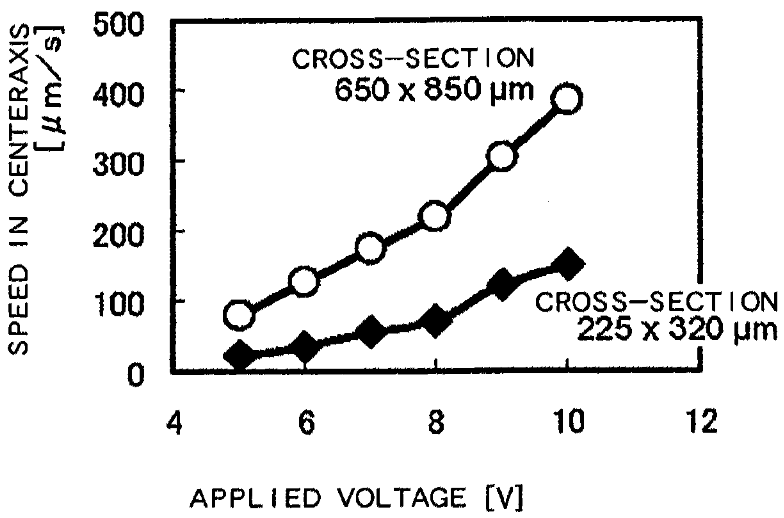
FIG. 5 is a graph showing characteristics of the micropump.

FIG. 5 is a graph showing characteristics of the micropump. FIG. 5 shows a result of characteristics with respect to a voltage applied to a pair of electrodes, which is obtained by measuring speed from the length of each track of the fluorescent beads shown in FIG. 4. The two characteristics were obtained by being measured in two circulatory closed-loop flow paths one of which (○) has a flow path cross-section having a depth of 650 μm and a width of 850 μm and the other one of which (♦) has a flow path cross-section having a depth of 225 μm and a width of 320 μm, respectively. A flow velocity of about 400 μm/s and a flow velocity of about 150 μm/s were respectively obtained under an AC applied voltage of 5 MHz and 10V. It is understood that the flow running in the circulatory closed-loop flow path is a laminar flow (Hagen-Poiseuille flow) having a parabolic velocity distribution in which the velocity is maximized at the center of the flow path. Therefore, it was confirmed that each microfluidic device of FIGS. 2 and 3 acts as a micropump generating a flow that has a considerably fast velocity (several hundred micrometers/s) and that is a nonturbulent, smooth flow.

Embodiment 2

Figure 6:
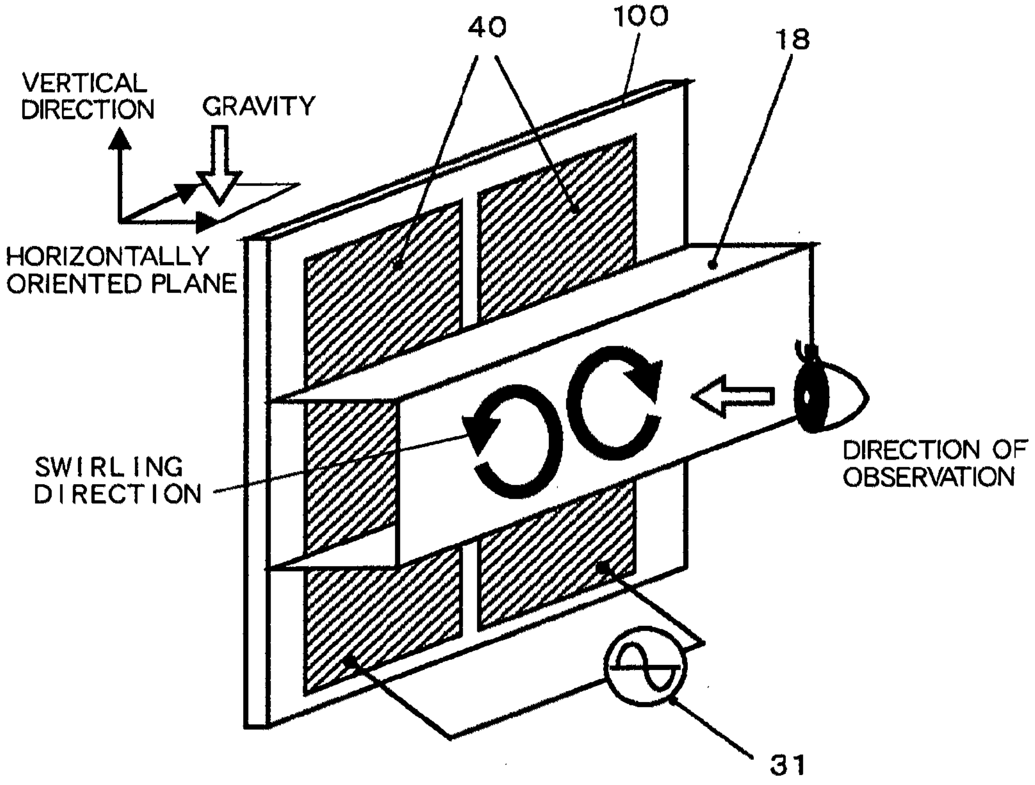
FIG. 6 is an enlarged view of a micromixer of the present invention.

FIG. 6 is an enlarged view of a micromixer of the present invention. The present inventors further performed an experiment using a device structured so that a flow path extending in the horizontal direction intersects the pair of electrodes 40 arranged in the vertical direction as shown in FIG. 6. As a result, the present inventors found that two eddies between which an electrode-to-electrode gap lies occur.

Figure 7:
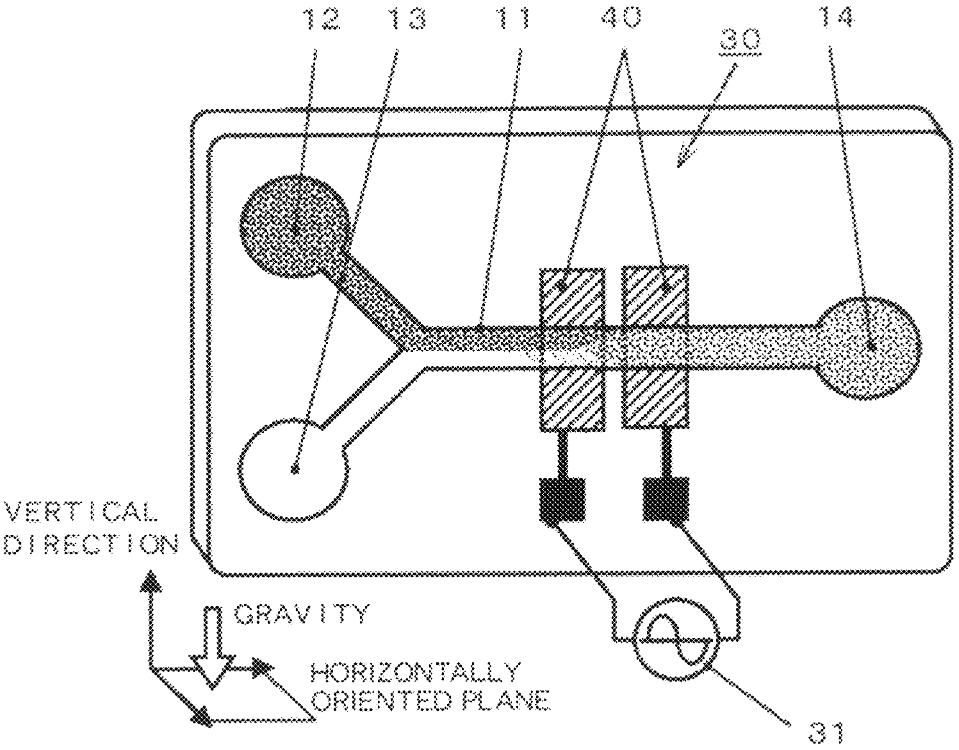
FIG. 7 is an elevational view of a microfluidic device provided with the micromixer.

FIG. 7 is an elevational view of a microfluidic device provided with the micromixer. The present inventors performed an experiment as followed. A Y-shaped flow path having two inflow paths is produced as shown in FIG. 7, and a physiological saline is poured from a first inflow port 12, whereas a physiological saline containing fluorescent beads for experimental observation is poured from a second inflow port 13. The fluorescent beads in a laminar-flow state flowing near the lower wall surface in the flow path moved close to the upper wall surface, opposite to the lower one of the flow path, at a fast speed when the fluorescent beads passed through the electrode-to-electrode gap (50 μm) of the pair of electrodes 40. From this fact, it was understood that the flow crossing the flow path between the two eddies is considerably fast, and hence the device can be used as a micromixer 30.

The micromixer 30 of the present invention can generate eddies regardless of the presence or absence of a flow in the direction of the flow path. Therefore, if the flow is stopped in a state in which a sample is kept within a distance (about four times as long as the flow path width) equal to twice as long as eddy, mixing and stirring can be continuously performed for a long time.

Figure 8:
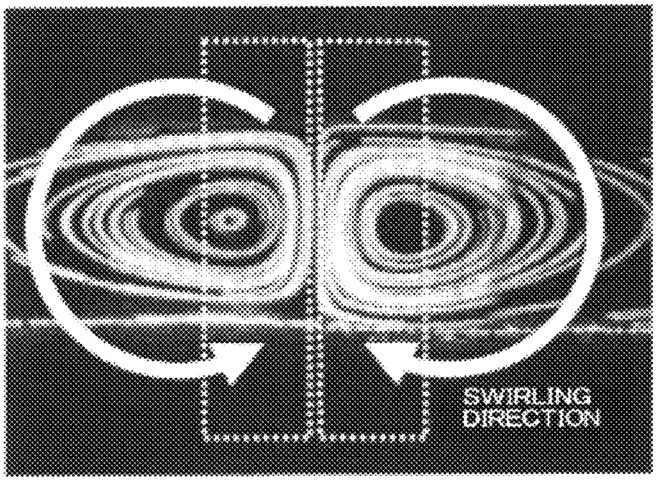
FIG. 8 is a photograph in which eddies of the micromixer are visualized.

FIG. 8 is a photograph in which eddies of the micromixer are visualized. The photographic image of FIG. 8 is obtained by visualizing eddies generated in the state of stopping the flow by use of the fluorescent beads. As can be understood from FIG. 8, if the micromixer of the present invention is used, small amounts of sample plugs that correspond to a length which is about four times as long as the flow path width can be treated. Therefore, a reactor, an inspection device, or an analytical instrument having small dead volume can be easily realized.

Figure 9:
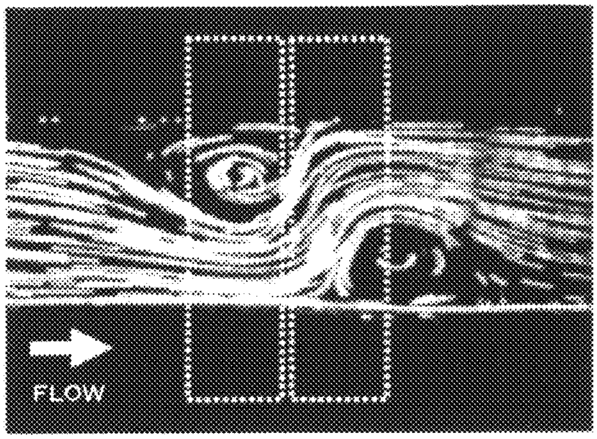
FIG. 9 is a photograph in which eddies of the micromixer are visualized when there is a flow in the horizontal direction.

FIG. 9 is a photograph in which eddies of the micromixer are visualized when there is a flow in the horizontal direction. The photograph of FIG. 9 was taken in a state in which the micromixer was set under the presence of a flow of 5 μL/minute. As shown in FIG. 9, it is apparent that the micromixer according to this embodiment operates under the presence of such a flow, and the micromixer can, of course, be used as a part of a continuous on-line process.

In the two embodiments mentioned above, the two examples were shown. In one of the two examples, the direction of a part of the micro-sized flow path being in contact with the pair of electrodes 40 is parallel to, i.e., intersects at an angle of zero degrees with that of the electrode-to-electrode gap lying between the pair of electrodes 40, and, in the other example, the direction of a part of the micro-sized flow path being in contact therewith is perpendicular to, i.e., intersects at right angles with that of the electrode-to-electrode gap lying therebetween. However, the present invention is not limited to these two angles. If these intersect with each other at an angle of degrees greater than zero degrees and smaller than 90 degrees, it is possible to realize a device concurrently having two functions one of which is to pump fluids flowing in the flow path in the direction of the axis of the flow path and the other one of which is to move fluids flowing in the flow path in the vertical direction and mix these fluids together.

Additionally, in the two embodiments mentioned above, a description was given of the two slender flow paths one of which is a circulatory closed-loop type and the other one of which is a circulatory open-loop type in which fluids flow from an inflow end to an outflow end. However, the gist of the present invention does not reside in the imposition of limitations on the width of the flow path. If the micropump and the micromixer of the present invention are structured to have effective operations, any kind of flow path can be employed.

Figure 10:
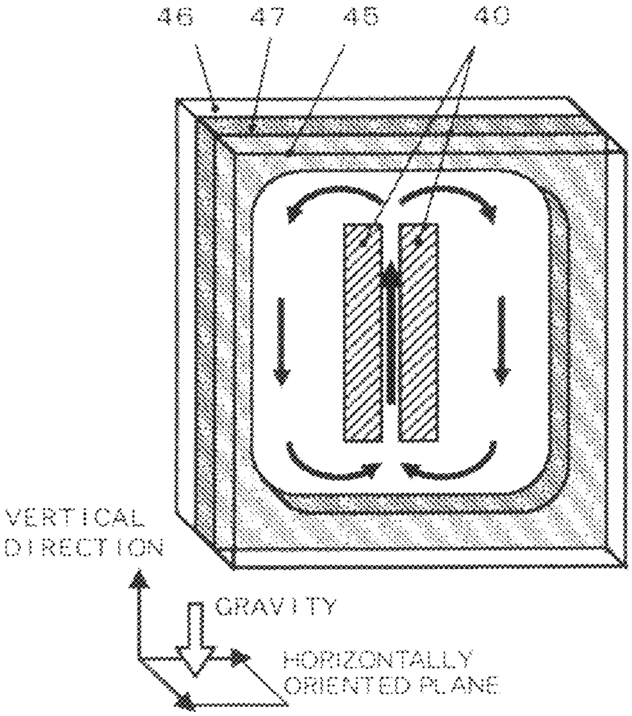
FIG. 10 is an elevational view of the microfluidic device in which stirring is performed by a space between parallel flat substrates.

FIG. 10 is an elevational view of the microfluidic device in which stirring is performed by a space between parallel flat substrates. For example, in FIG. 10, a sample substrate 45 having a surface onto which a sample is applied and fixed and an electrode substrate 46 having a surface onto which a pair of electrodes 40 are patterned by optical lithography are allowed to face each other, and a space between the parallel flat substrates which is formed by sandwiching a spacer 47 ranging from about several tens of micrometers to about several hundred micrometers therebetween is used as a flow path.

In a flow path having a two-dimensional extension as in the example of FIG. 10, the flow of a liquid ascending along the electrode-to-electrode gap of the pair of electrodes 40 descends at a position away from the pair of electrodes 40, and circulates in the space between the parallel flat substrates. In an analysis of a biologic sample, there are many processes requiring a long-time reaction, such as gene hybridization, enzyme reaction, and antigen-antibody reaction. The use of the microfluidic device provided with the pair of electrodes 40 of FIG. 10 makes it possible to stir small amounts of samples in the space between the parallel flat substrates. As a result, the reaction rate is accelerated by stirring, and hence the process time for inspection or analysis can be shortened. This device is effective especially for array chips used to analyze biological materials, such as gene chips or protein chips.

As described in the above embodiments, according to the present invention, it is possible to realize a micropump and a micromixer both of which are easily controlled in a simple structure and are operated with liquids (including a physiological saline) which has an electrical conductivity of 10 mS/m or more. Additionally, the present invention can be applied to all microfluidic devices that can use the micropump and the micromixer. Still additionally, the present invention can be applied to all inspection devices and analytical instruments that can be used. Concrete examples will be hereinafter shown.

Embodiment 3

Figure 11:
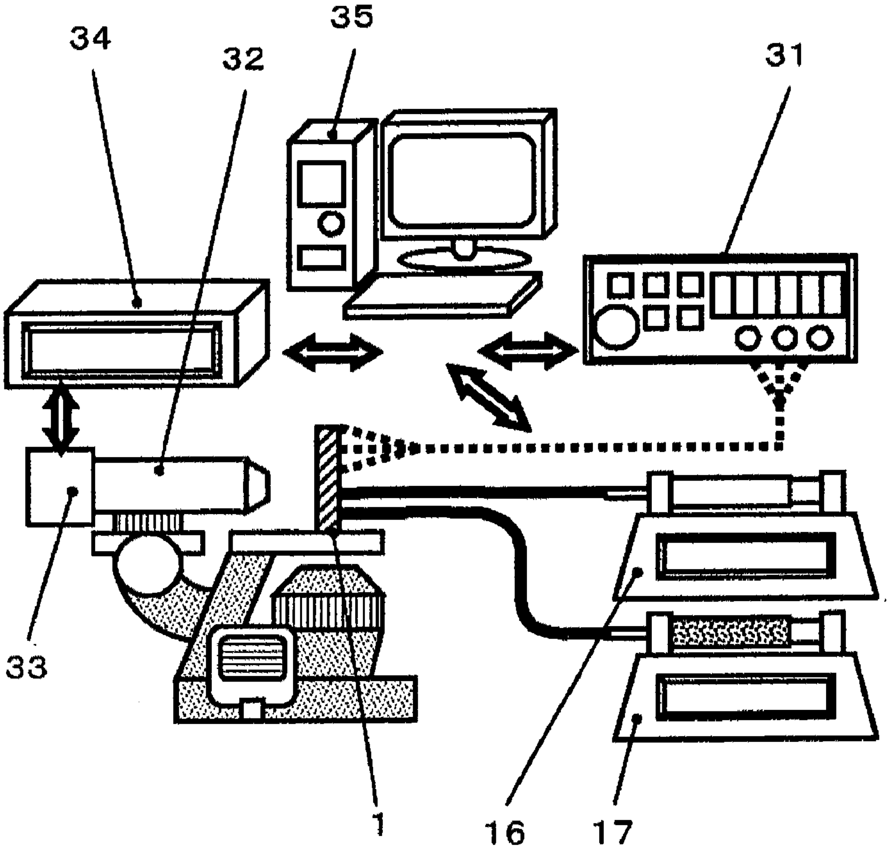
FIG. 11 is a general view of an analytical instrument of the present invention.

FIG. 11 is a general view of an analytical instrument provided with the microfluidic device of the present invention. In this embodiment, an example is shown in which the present invention is applied especially for a platelet aggregation test by which a platelet clump size is measured, and the structure and the operation of the instrument will be described.

As a preprocessing step for inspection, a platelet sample of platelet-rich plasma (PRP) or platelet-poor plasma (PPP) is prepared from the blood which has been drawn from a subject and mixed into 3.8% citric-acid solution, and is incubated at 37° C. equal to the body temperature in a sample reservoir (not shown). On the other hand, 0.3 μM epinephrine is produced as a platelet-aggregating agent, and is set in a reservoir for the aggregating agent provided at a liquid supply pump 16.

The plasma of the incubated platelet sample is replaced with a physiological saline, and then a small amount of the sample is dropped into an open well provided in a microfluidic device 1 by use of a pipet. This microfluidic device 1 is vertically oriented, and is set on a stage of a microscope 32. The liquid supply pump 16 that supplies a platelet-aggregating agent and a suction pump 17 that sucks out a waste fluid or the like are connected to the microfluidic device 1 through tubes. The AC power 31 that drives the micropump and the micromixer too is connected to the microfluidic device 1 through three electric cables.

The state and the change of the platelet in the microfluidic device are converted into an electric signal by a CCD camera 33 disposed on the microscope 32, and is input to a data acquiring and analyzing device 34 that performs image analysis, image processing, image storage, and the like. A process controller 35 controls a process necessary for inspection according to a program through interfaces with the liquid supply pump 16, the suction pump 17, the AC power 31, and the data acquiring and analyzing device 34.

Figure 12:
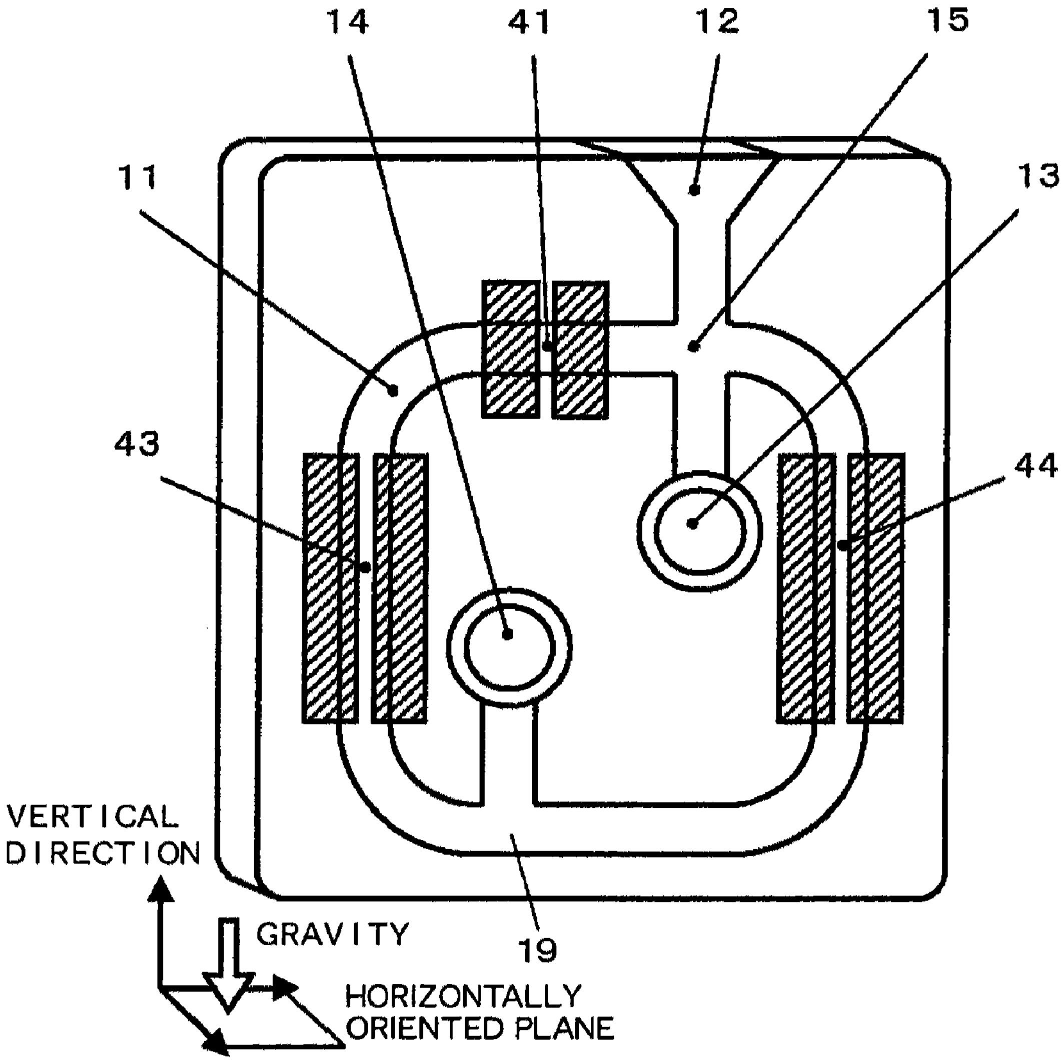
FIG. 12 is an elevational view of a microfluidic device used for the analytical instrument.

FIG. 12 is an elevational view of a microfluidic device used for the analytical instrument. The structure of the microfluidic device used in this embodiment will be described with reference to FIG. 12. The first inflow port 12 is an open well, and a sample is injected through this port according to, for example, a method of dropping it by use of a pipet. The second inflow port 13 and the outflow port 14 are connected to the liquid supply pump 16 and the suction pump 17 of FIG. 11, respectively.

The micro-sized flow path 11 has a circulating-flow-path structure, and includes a flow path intersection 15 made up of a flow path extending from the first inflow port 12 and a flow path extending from the second inflow port 13, the micromixer 41 mentioned in the second embodiment of the present invention, the micropump 43 of the present invention circulating in the clockwise direction, a T-shaped intersection flow path 19 leading to the outflow port 14, and the micropump 44 of the present invention circulating in the counterclockwise direction which are arranged in this order.

FIG. 13A to FIG. 13D are views explaining the operation of the microfluidic device used in the analytical instrument. Next, the operation of the analytical instrument will be described according to steps programmed by the process controller of FIG. 11. A description thereof will be started from a step in which all flow paths of the microfluidic device of FIG. 12 are pre-filled with a physiological saline 20. Although various methods can be proposed as procedures for filling the flow paths with this physiological saline, a description of this is omitted here. The cross-section of the circulatory flow path used here is a rectangle having a width of 400 μm and a depth of 320 μm.

Figure 13A:
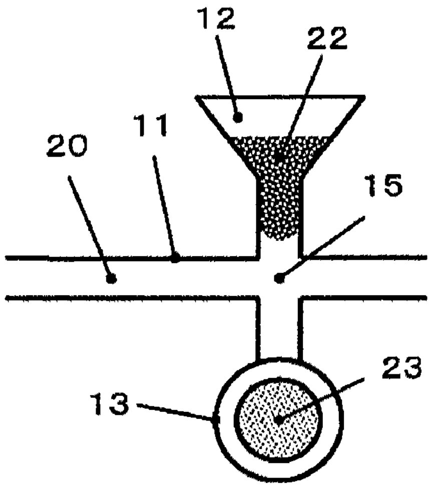
FIG. 13A to FIG. 13D are views explaining the operation of the microfluidic device used in the analytical instrument.

First, a drop of platelet sample 22 (20 to 50 μL) is put from the pipet into the first inflow port 12 that is an open well, and an inspection process is started. FIG. 13A shows a state near the flow path intersection 15 when the inspection process is started.

Figure 13B:
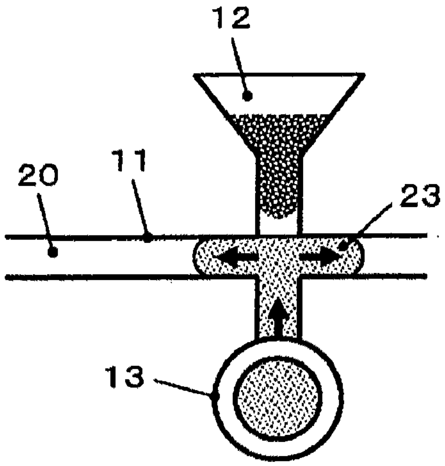

Thereafter, when the liquid supply pump 16 (2 μL/minute) and the suction pump 17 (2 μL/minute) are turned on at the same time, a physiological saline 20 flows out from the outflow port 14, and a platelet-aggregating agent 23 having the same volume flows in from the second inflow port 13. After six seconds, a plug of the platelet-aggregating agent 23 of 1500 μm is generated centering the flow path intersection 15 as shown in FIG. 13B.

Figure 13C:
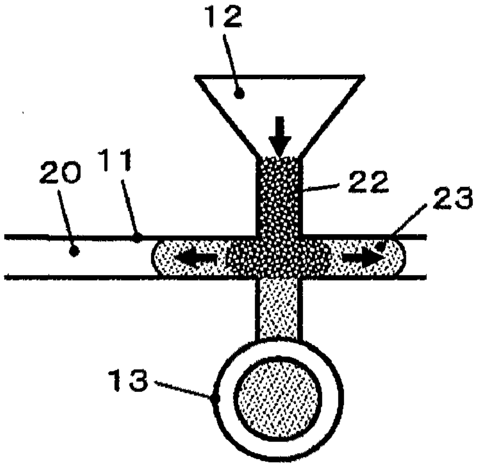

Thereafter, when only the liquid supply pump 16 is turned off (in the state in which six seconds have elapsed), the platelet sample 22 is injected from the first inflow port 12, which is an open well, through the cross intersection flow path this time. After three seconds, a plug is generated in which the platelet sample 22 of 750 μm is sandwiched at the center of the platelet-aggregating agent 23 whose length is 1500 μm as shown in FIG. 13C. At this stage, the suction pump 17 is also turned off.

Figure 13D:
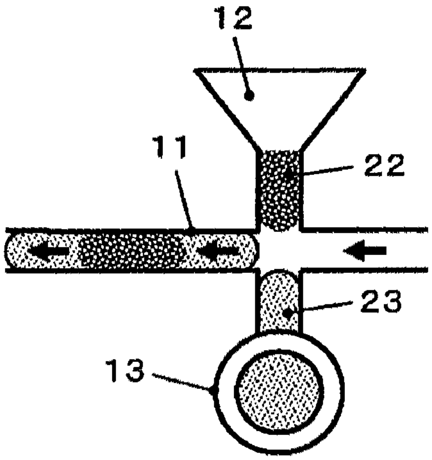

Thereafter, a terminal of the AC power 31 that is connected to the micropump 44 used to circulate liquids in the counterclockwise direction is turned on, and the plug including the sample is moved toward the micromixer. This state is shown in FIG. 13D.

When the plug including the sample reaches the micromixer 41, a terminal of the AC power 31 that is connected to the micromixer 41 is turned on, and the platelet sample 22 and the platelet-aggregating agent 23 start being mixed and stirred together.

Figure 14:
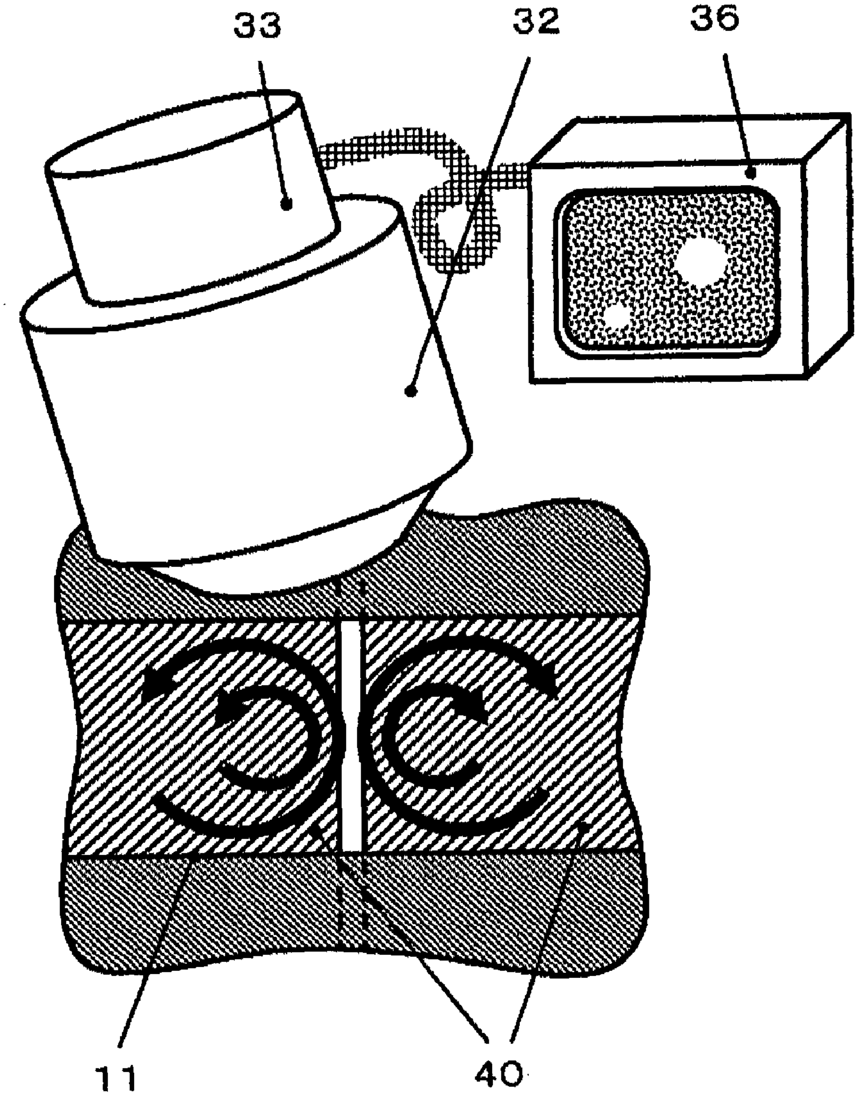
FIG. 14 is a partially enlarged view of a detecting unit of the analytical instrument.

FIG. 14 is a partially enlarged view of a detecting unit of the analytical instrument. A change in the size of the clump of the platelet with the lapse of the stirring time can be observed with a monitor 36 via the microscope 32 and the CCD camera 33 as shown in FIG. 14. At the same time, measurement and analysis can be performed for succeeding steps.

Figure 15:
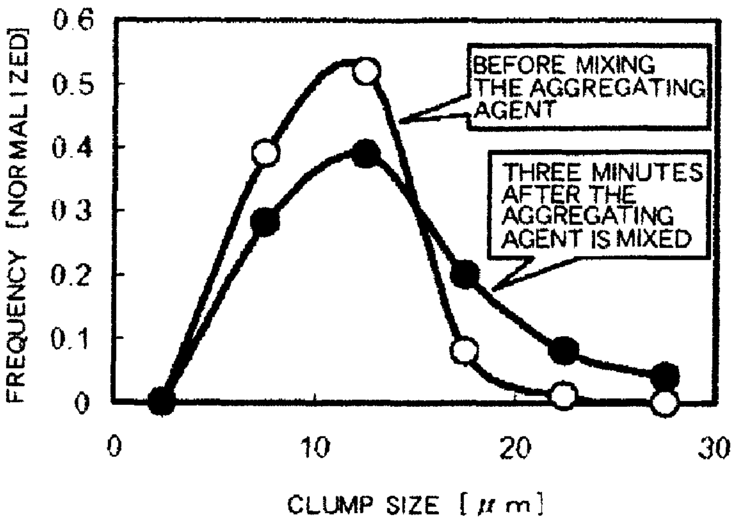
FIG. 15 is a graph showing analysis results.

FIG. 15 is a graph showing analysis results. FIG. 15 shows an analysis example of a comparison between the particle-size distribution of the platelet aggregate obtained when the platelet sample and the aggregating agent start being mixed together and the particle-size distribution of the platelet aggregate obtained when three minutes elapse after being mixed.

If the micropump 43, which circulates liquids in the clockwise direction, is used together with the micropump 44, which circulates liquids in the counterclockwise direction, as a pair, the micropump 43 will be useful especially when accurate position control is required although this has not been described here. For example, the micropump 43 is useful when the position of a sample plug is caused to exactly coincide with the electrode-to-electrode gap of the micromixer 41 while performing fine position control or when an air plug generated during preparation for filling all flow paths with a physiological saline or a plug of a specific reaction product is led to the T-shaped flow path of the outflow port so as to extract the plug therefrom.

The volume of the platelet sample and the volume of the platelet-aggregating agent used for the measurement in this embodiment are 0.1 μL and 0.2 μL, respectively. As described above, according to the present invention, an analytical instrument that is extremely small in the amount of samples consumed and in dead volume can be realized.

Although the aggregometer using a platelet sample, for example, was disclosed in the embodiment of the analytical instrument of the present invention, the biological materials to which the microfluidic device proposed here are applied is not limited to platelets. The biological materials include all of biochemical materials and biologic samples each of which is microns in diameter or smaller than microns, such as gene, antibody, protein, virus, cell, blood, and bacteria.

Additionally, according to the gist of this proposal, the sample used in the analytical instrument is not limited to biological materials. All chemicals that require a mixer that causes reactions in microchannels can be used in the analytical instrument, and all solutions and dispersion liquids that are required to be conveyed by a pump in microchannels can be used in the analytical instrument.

Figure 16:
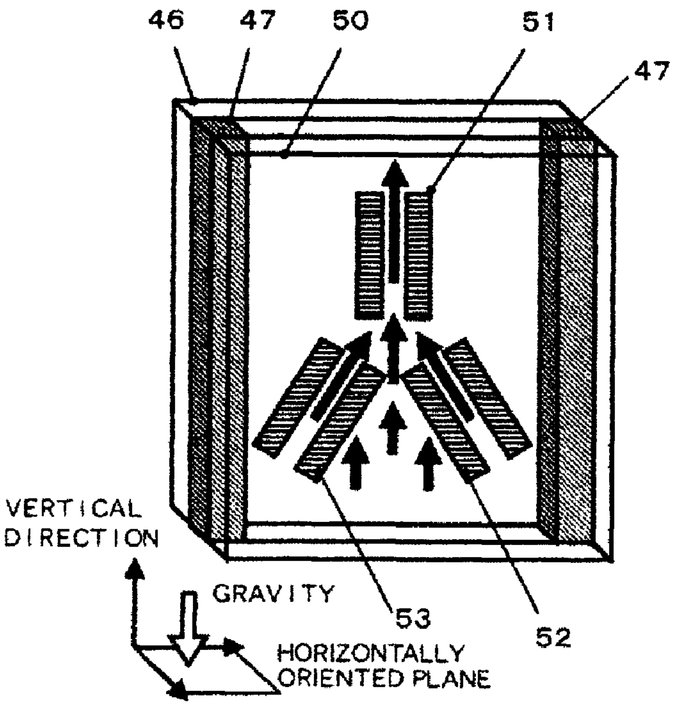
FIG. 16 is an elevational view of a microfluidic device in which flows are combined together through spaces each of which lies between parallel flat substrates.
Figure 17:
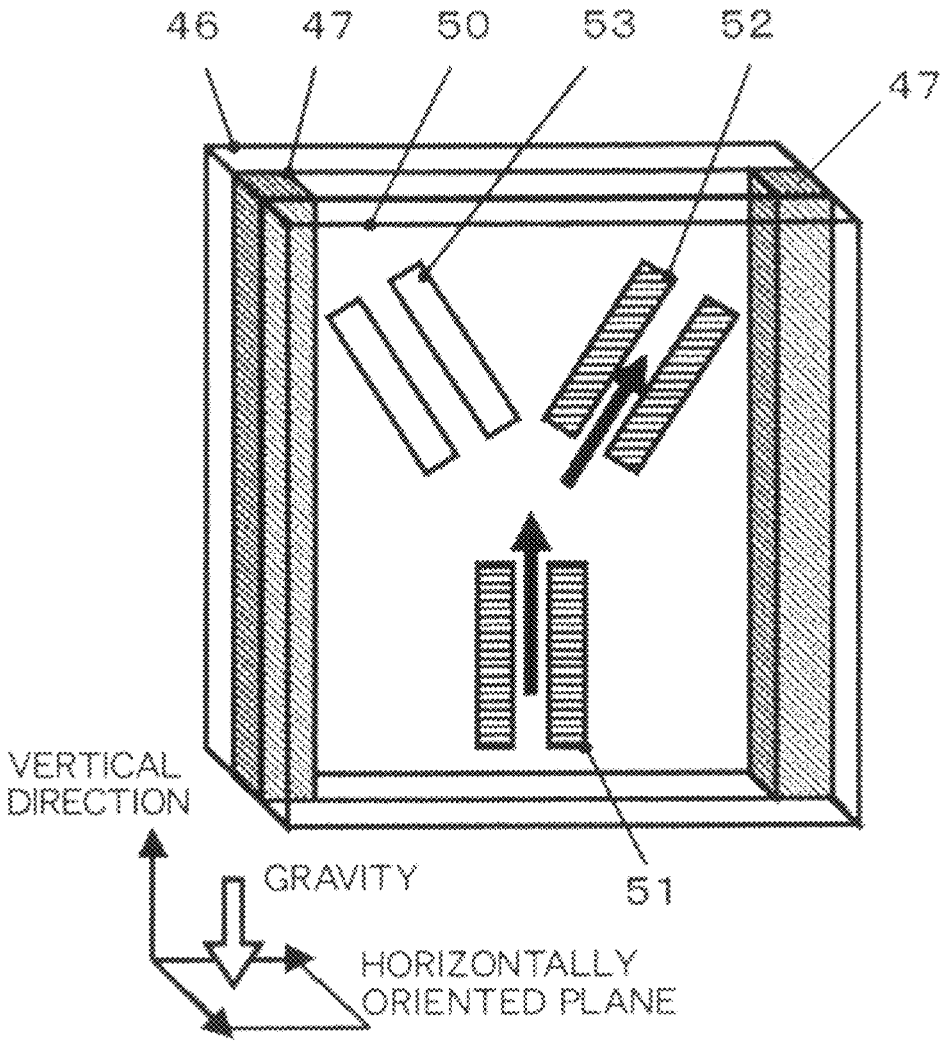
FIG. 17 is an elevational view of a microfluidic device in which a flow is divided by spaces each of which lies between parallel flat substrates.

FIG. 16 and FIG. 17 are views each of which shows a microfluidic device structured to have a space (sandwiched between the electrode substrate 46 and a substrate 50 facing the electrode substrate 46) between two parallel wall surfaces between which a spacer 47 is placed, as in FIG. 10. As general properties, in proportion to a decrease in space, it becomes more difficult for a fluid in such a flow path to flow. The reason is that the ratio between (two-dimensional) viscous drag that a fluid extending in the direction of a plane receives from the wall surfaces and the (three-dimensional) volume of the fluid becomes greater in proportion to the narrowing of a space. Therefore, to generate a flow, an extremely great force or pressure is required to be applied. However, the present inventors found that the following two characteristics will appear if a pair of electrodes are disposed on the wall surfaces.

The first characteristic is that the speed of an ascending flow generated in the electrode-to-electrode gap is not reduced even if the gap is 200 μm or less. Without being limited to this, there is a case in which the speed is increased depending on conditions. The second characteristic is that, if the electrode-to-electrode gap of the pair of electrodes on the wall surfaces is arranged to be diagonally directed (i.e., in a direction rotated from the vertical direction) while maintaining the direction (vertical direction) of the parallel wall surfaces, a flow generated in the electrode-to-electrode gap is allowed to run in the diagonal direction in the same way along the electrode-to-electrode gap directed diagonally. However, the speed of the flow becomes slower in proportion to an increase in angle, and becomes approximately zero when the flow is directed in the horizontal direction (i.e., at an angle of 90 degrees from the vertical direction).

Embodiment 4

FIG. 16 is an elevational view of a microfluidic device in which flows are combined together through spaces each of which lies between parallel flat substrates. Next, an example of a device using the two characteristics mentioned above will be hereinafter shown. The embodiment shown in FIG. 16 achieves the combining of wide flows by an action generated by pairs of electrodes arranged to have the shape of the reversal of the letter Y.

The pairs of electrodes in this embodiment are disposed such that a second pair of electrodes 52 and a third pair of electrodes 53 are disposed diagonally open at the lower end of a first pair of electrodes 51 directed in the vertical direction. When an AC voltage is applied to all of the three pairs of electrodes, a diagonal flow running at a speed that has undergone vector resolution according to an angle with respect to the vertical direction is generated in the electrode-to-electrode gap of the second pair of electrodes 52 and in the electrode-to-electrode gap of the third pair of electrodes 53. Additionally, a fast vertically-ascending flow is generated in the first pair of electrodes 51. As a result of the combination of these operations, the comparatively slow diagonal flow generated by the second and third pairs of electrodes 52 and 53 can join with even slower flows running in the planar flow paths, and can act like a funnel that sends the resulting flow into the space between the first pair of electrodes 51 between which a fast flow is running.

FIG. 17 is an elevational view of a microfluidic device in which a flow is divided by spaces each, of which lies between parallel flat substrates. The embodiment shown in FIG. 17 achieves a function to give selective distribution/switching to a flow in accordance with some kind of information concerning a sample conveyed to a fast flow running between the first pair of electrodes 51 in a state in which the arrangement of the electrodes shown in the above embodiment is turned upside down. In this embodiment, for example, particles emitting fluorescence are optically detected, and, based on information thereabout, a voltage to be applied to the second and third pairs of electrodes 52 and 53 is turned on/off or is switched in accordance with a timing at which the particles pass through, and, as a result, only necessary particles can be collected at a specific laminar flow position. In FIG. 17, the AC voltage to be applied to the third pair of electrodes 53 is in an OFF state, whereas the first and second pairs of electrodes 51 and 52 are in an ON state, and the flow is running in the right upward direction while being guided by the electrodes to which a voltage has been applied.

In each of the embodiments of FIGS. 16 and 17, the device has a structure in which two of the four sides of the device are closed with the spacer, whereas the other two are brought into an open state, and a fluid is supported by a capillary force of the fluid. However, the present invention is achieved regardless of the structure or the number of spacers to be used. Therefore, a spacer that surrounds the device as shown in the embodiment of FIG. 10 may be used, and spacers having any other shapes may be used.

As described in the above embodiments, according to the present invention, it is possible to achieve a microfluidic device having a simple structure in which flows are combined together along electrodes subjected to patterning on wall surfaces, are then guided at a fast flow speed, and are distributed or classified, without providing partitions in a flow path of a narrow space lying between two parallel planes. Additionally, fluids can be manipulated unlike in a conventional microfluidic device that uses a thin flow path, and hence the degree of freedom of design of the microfluidic device can be further widened.

The entire contents of all of the publications, the patents, and the patent applications cited in this specification are hereby incorporated by reference.

INDUSTRIAL APPLICABILITY

As described above, the present invention achieves a micropump and a micromixer each of which has a simple structure, and provides a microfluidic device that includes the micropump and the micromixer each of which serves as a basic part of the microfluidic device. Additionally, the present invention can be applied to all instruments, apparatuses, or machines using the microfluidic device, such as a chemical analytical instrument, a biological material inspection apparatus (μTAS), a microchemical reactor, and a micromachine (MEMS).

What is claimed is:

1. A microfluidic method comprising:

providing:

(1). a first substrate and a second substrate that are disposed to face each other with a flow path defined between the first and second substrates; and (2). a pair of vertically orientated flat electrodes disposed to face each other on a surface of the first substrate, the flow path being in contact with the surface, wherein a continuously vertically orientated space separates the pair of vertically orientated flat electrodes; and applying an alternating current (AC) voltage to the pair of electrodes using an AC power source to cause a buoyant flow to be generated by Joule heat within the flow path, the buoyant flow flowing in a direction opposite to gravity along the space separating the pair of flat electrodes.

2. The microfluidic method of claim 1, wherein the flow path is formed in a vertical direction in contact with the pair of electrodes.

3. The microfluidic method of claim 1, wherein the flow path is formed in a horizontal direction that is in contact with the pair of electrodes.

4. The microfluidic method of claim 1, wherein the fluid flows in a circular flow path between the first substrate and the second substrate.

* * * * *